United States Patent
Yang et al.

[11] Patent Number: 6,114,885
[45] Date of Patent: Sep. 5, 2000

[54] INTEGRATED DRIVER CIRCUITS HAVING INDEPENDENTLY PROGRAMMABLE PULL-UP AND PULL-DOWN CIRCUITS THEREIN WHICH MATCH LOAD IMPEDANCE

[75] Inventors: Seung-Kweon Yang; Yong-Jin Yoon, both of Seoul, Rep. of Korea

[73] Assignee: Samsung Electronics Co., Ltd., Rep. of Korea

[21] Appl. No.: 09/138,641

[22] Filed: Aug. 24, 1998

[30] Foreign Application Priority Data

Aug. 22, 1997 [KR] Rep. of Korea ............... 97-40273

[51] Int. Cl.$^7$ .................................................. H03K 3/00
[52] U.S. Cl. .......................... 327/112; 327/437; 326/27; 326/85; 307/98
[58] Field of Search .................... 327/436, 437, 327/108–112, 389, 391, 210, 211, 212; 326/27, 30, 37, 82–87, 26, 28, 36; 307/98; 323/313, 314

[56] References Cited

U.S. PATENT DOCUMENTS

| | | | |
|---|---|---|---|
| 4,823,029 | 4/1989 | Gabara | 326/27 |
| 5,097,148 | 3/1992 | Gabara | 326/86 |
| 5,194,765 | 3/1993 | Dunlop et al. | 326/87 |
| 5,243,229 | 9/1993 | Gabara et al. | 307/98 |
| 5,254,883 | 10/1993 | Horowitz et al. | 326/30 |
| 5,298,800 | 3/1994 | Dunlop et al. | 327/108 |
| 5,606,275 | 2/1997 | Farhang et al. | 327/108 |
| 5,666,078 | 9/1997 | Lamphier et al. | 327/108 |

OTHER PUBLICATIONS

Gabara et al., "Digitally Adjustable Resistors in CMOS for High–Performance Applications", IEEE Journal of Solid–State Circuits, vol. 27, No. 8, Aug. 1992, pp. 1176–1185.

Primary Examiner—Timothy P. Callahan
Assistant Examiner—Minh Nguyen
Attorney, Agent, or Firm—Myers Bigel Sibley & Sajovec

[57] ABSTRACT

Integrated driver circuits include a pull-up circuit having a first plurality of PMOS pull-up transistors therein which are selectively enabled by a first multi-bit impedance control signal. This first multi-bit impedance control signal is a function of a first variable resistance device. A pull-down circuit is also provided. The pull-down circuit has a first plurality of NMOS pull-down transistors therein which are selectively enabled by a second multi-bit impedance control signal. This second multi-bit impedance control signal is a function of a resistance of a second variable resistance device. The pull-up circuit and pull-down circuit have commonly connected outputs. In particular, the pull-up circuit has a first impedance which is a function of a digital value of the first multi-bit impedance control signal and the pull-down circuit has a second impedance which is a function of a digital value of the second multi-bit impedance control signal. Moreover, the first variable resistance device and the second variable resistance device may be external to the pull-up circuit and the pull-up circuit, respectively. The resistances of the first and second variable resistance devices may also be independently controllable as separate potentiometers.

14 Claims, 9 Drawing Sheets

INTEGRATED DRIVER CIRCUITS HAVING INDEPENDENTLY PROGRAMMABLE PULL-UP AND PULL-DOWN CIRCUITS THEREIN WHICH MATCH LOAD IMPEDANCE

FIELD OF THE INVENTION

The present invention relates to integrated circuits, and more particularly to integrated circuits having programmable driver circuits therein.

BACKGROUND OF THE INVENTION

Programmable driver circuits are typically used to drive loads while simultaneously matching the impedance of the loads being driven. Because mismatch between the impedance of a driver circuit and the characteristic impedance of the load is very undesirable in high performance and small signal applications (e.g., SRAM memory device applications), external variable resistors have been used to program the impedance of a driver circuit to match the impedance of the load.

Exemplary driver circuits are disclosed in U.S. Pat. No. 5,666,078 to Lamphier et al. entitled "Programmable Impedance Output Driver" and in an article by T. J. Gabara et al. entitled "Digitally Adjustable Resistors in CMOS for High-Performance Applications", IEEE Journal of Solid-State Circuits, Vol. 27, No. 8, pp. 1176–1185 (1992). U.S. Pat. No. 5,254,883 to Horowitz et al. entitled "Electrical Current Source for a Bus" also discloses the use of an external resistor to control the impedance of an on-chip driver.

In particular, the '078 patent discloses an output driver circuit which includes an external resistance device, a voltage comparator device, control logic, an evaluate circuit and an off-chip driver circuit. A first voltage from the external resistance device is compared with a second voltage generated by the evaluate circuit. The voltage comparator device then indicates to the control logic whether the voltage generated by the evaluate circuit is greater than or less than the voltage from the external resistance device. The control logic then adjusts the evaluate circuit with a digital count until the first and second voltages are basically equal (i.e., the count is alternating between two adjacent binary count values). The control logic then sets the output driver circuit to a resistance corresponding to the lower of the two count values, to thereby produce a proper driving impedance. The Gabara et al. article also discloses a series-terminated transmission line driver circuit at FIG. 3 which uses digitally controlled pull-up and pull-down MOS resistors formed from binary-weighted transistor widths. In addition, FIG. 4 of the Gabara et al. article discloses a lower transistor array reference circuit which uses an external off-chip fixed resistor $R_1$ and two on-chip silicide resistors $R_2$ and $R_3$ to generate a plurality of low control signals L0–L5. These low control signals digitally set the value of the pull-down MOS resistor. FIG. 9 of the Gabara et al. article also discloses an upper transistor array which does not use an external off-chip fixed resistor but, instead, uses the low control signals L0–L5 generated by the lower transistor array reference circuit of FIG. 4 to establish a proper value of the pull-up MOS resistor.

Referring now to FIGS. 1A–1C, 2–3 and 7, a conventional driver circuit which uses a single off-chip variable resistor to provide impedance control will be described. In particular, FIG. 1A is a block diagram of a driver circuit which includes an off-chip driver 130 for driving a transmission line having a characteristic impedance Z0=ZQ. Here, the off-chip driver 130 drives an output DQ with a logic 1 or logic 0 potential which corresponds to a differential data signal DATA/DATAB. This differential data signal may be generated by a pair of differential bit lines in an SRAM memory device, for example. As illustrated in detail by FIG. 3, the off-chip driver 130 includes a plurality of NMOS pull-up transistors PUT1–PUT6 which are connected in parallel between a first reference potential VDDQ and the output DQ and a plurality of NMOS pull-down transistors PDT1–PDT6 which are connected in parallel between a second reference potential VSSQ and the output DQ. Each of the pull-up transistors PUT1–PUT6 has a gate electrode which is responsive to a respective impedance control pull-up signal (i.e., DOU1–DOU5 and DOUS) and each of the pull-down transistors PDT1–PDT6 has a gate electrode which is responsive to a respective impedance control pull-down signal (i.e., DOD1–DOD5 and DODS). As will be understood by those skilled in the art, a digitally adjustable pull-up (or pull-down) impedance is formed by the transistor array PUT1–PUT5 consisting of five MOS transistors which are each controlled by a digital signal. The width of each of the five transistors may be selected so that the least significant impedance control pull-up signal DOU1 enables the device with width $2^0 W_{ref}$ while the most significant impedance control pull-up signal DOUS enables the device with width $2^4 W_{ref}$. Thus, the impedance control pull-up signals PUT1–PUT5 can be used to dynamically adjust the width of the combined transistor array.

Referring again to FIG. 1A, these impedance control pull-up and pull-down signals DOUx and DODx are generated by a conventional output buffer 120 which receives a differential data signal DATA/DATAB and the multi-bit output DZQx of a ZQ driver 110 which, as illustrated best by FIG. 7, is responsive to an output enable control signal HIZs and a multi-bit count signal CTQx. A conventional output buffer 120 is illustrated by FIG. 1C. A single bit of the count signal CTQx may be denoted as CTQi and a single bit of the output DZQx may be denoted as DZQi. Thus, for each bit of the count signal CTQx, the ZQ driver 110 includes a plurality of inverters (I1–I4) and a pair of NMOS pull-down transistors N1–N2 and a pair of PMOS pull-up transistors P1–P2 which are connected in series as a CMOS inverter. As will be understood by those skilled in the art, whenever the output enable control signal HIZs is set to a logic 0 potential, the output of the CMOS inverter will be held in a high impedance state and the output DZQi will be latched at a level which is the logical complement of the state of the output of the CMOS inverter just prior to entering the high impedance state.

The multi-bit count signal CTQx is generated by a ZQ counter 160 which is responsive to an internal clock and signal UDZQ. Signal UDZQ (count-up/count-down command signal) is generated by a ZQ comparator 150 of conventional design, as illustrated by FIG. 1B. The ZQ comparator 150 is also responsive to the internal clock. The multi-bit count signal CTQx is also fed back to a ZQ detector 140 which generates a reference voltage REFIO. As explained more fully hereinbelow with respect to FIG. 2, this reference voltage REFIO varies in response to the multi-bit count signal CTQx. Moreover, this reference voltage REFIO is compared to the potential which appears across an off-chip variable resistor 170 (having a resistance RQ) at pad ZQPAD. In particular, the comparator 150 controls the level of the UDZQ signal. The level of the UDZQ signal can be varied up or down by the comparator 150 depending on whether the reference voltage REFIO is greater than or less than the potential at pad ZQPAD. For example, a logic 0 UDZQ signal may be generated if REFIO>ZQPAD and a logic 1 UDZQ signal may be generated if REFIO<ZQPAD. The counter 160 also counts up or counts down and thereby varies the count signal CTQx in response to the level of the UDZQ signal.

Referring now to FIG. 2, the ZQ detector 140 includes a plurality of NMOS pull-down transistors PD1–PD6 which are responsive to the multi-bit count signal CTQx (e.g., CTQ1–CTQ5). A pair of PMOS pull-up transistors PU1 and PU2 are also provided to pull up pad ZQPAD and output node REFIO. As will be understood by those skilled in the art, the potential of pad ZQPAD will vary as the resistance of the off-chip variable resistor 170 is varied and the potential of output node REFIO will vary as the combined parallel resistance of NMOS pull-down transistors PD1–PD6 is varied in response to the multi-bit count signal CTQx. Moreover, the comparator 150 and counter 160 are configured so that any variation of the off-chip variable resistor 170 to a particular resistance value will result in the generation of a corresponding multi-bit count signal CTQx. This corresponding count signal CTQx will act to turn on one or more of the NMOS pull-down transistors PD1–PD6 so that the potential of output node REFIO can be adjusted to a potential which is essentially equal to the potential of pad ZQPAD. The ZQ driver 110 and output buffer 120 will then convert the corresponding count signal CTQx to a respective impedance control pull-up signal (i.e., DOU1–DOU5 and DOUS) or a respective impedance control pull-down signal (i.e., DOD1–DOD5 and DODS), depending on the value of the differential data signal DATA/DATAB. In this manner, the effective pull-up impedance or pull-down impedance of the off-chip driver 130 can be adjusted to match the characteristic impedance Z0 of the load. Unfortunately, the pull-up impedance established by the NMOS pull-up transistors PUT1–PUT6 of FIG. 3 may become unstable. This instability may be caused by parasitic back-bias effects that result when the source terminals of these NMOS pull-up transistors are pulled up to a positive potential (shown as VDDQ) relative to their respective substrate connections. The use of NMOS pull-up transistors may also lead to impedance instability if the power supply potential (VDD>VDDQ) is reduced to below about 2.5 volts.

Thus, notwithstanding these above-described off-chip driver circuits, there continues to be a need for improved off-chip driver circuits which provide accurate and stable pull-up and pull-down impedance control.

SUMMARY OF THE INVENTION

It is therefore an object of the present invention to provide improved integrated driver circuits.

It is another object of the present invention to provide integrated driver circuits having matched pull-up and pull-down impedance.

These and other objects, advantages and features of the present invention are provided by integrated driver circuits which include a pull-up circuit having a first plurality of PMOS pull-up transistors therein which are selectively enabled by a first multi-bit impedance control signal. This first multi-bit impedance control signal is a function of a first variable resistance device. A pull-down circuit is also provided. The pull-down circuit has a first plurality of NMOS pull-down transistors therein which are selectively enabled by a second multi-bit impedance control signal. This second multi-bit impedance control signal is a function of a resistance of a second variable resistance device. The pull-up circuit and pull-down circuit have commonly connected outputs.

In particular, the pull-up circuit has a first impedance which is a function of a digital value of the first multi-bit impedance control signal and the pull-down circuit has a second impedance which is a function of a digital value of the second multi-bit impedance control signal. Moreover, the first variable resistance device and the second variable resistance device may be external to the pull-up circuit and the pull-down circuit, respectively. The resistances of the first and variable resistance devices may also be independently controllable as separate potentiometers.

The preferred driver circuit also preferably includes means, electrically coupled to the pull-up circuit, for generating the first multi-bit of impedance control signal so that the first impedance can be set to a level which is proportional to the resistance of the first variable resistance device and means, electrically coupled to the pull-down circuit, for generating the second multi-bit impedance control signal so that the second impedance can be set to a level which is proportional to the resistance of the second variable resistance device. Here, the means for generating the first multi-bit impedance control signal preferably comprises a first detector having a second plurality of PMOS pull-up transistors therein and the means for generating the second multi-bit impedance control signal comprises a second detector having a second plurality of NMOS pull-down transistors therein. The means for generating the first plurality of impedance control signals also comprises a first comparator and a first counter responsive to an output of the first comparator. The first comparator compares the resistance of the first variable resistance device against a resistance of a reference PMOS pull-up transistor in the second plurality thereof and generates a count-up signal if the resistance of the first variable resistance device is greater than the resistance of the reference PMOS pull-up transistor. The first counter also counts up in response to the count-up signal. Similarly, the means for generating the second multi-bit control signal comprises a second comparator and a second counter responsive to an output of the second comparator. The second comparator compares the resistance of the second variable resistance device against a resistance of a reference NMOS pull-down transistor in the second plurality thereof and generates a count-down signal if the resistance of the second variable resistance device is greater than the resistance of the reference NMOS pull-down transistor. The second counter then counts down in response to the count-down signal.

DESCRIPTION OF PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
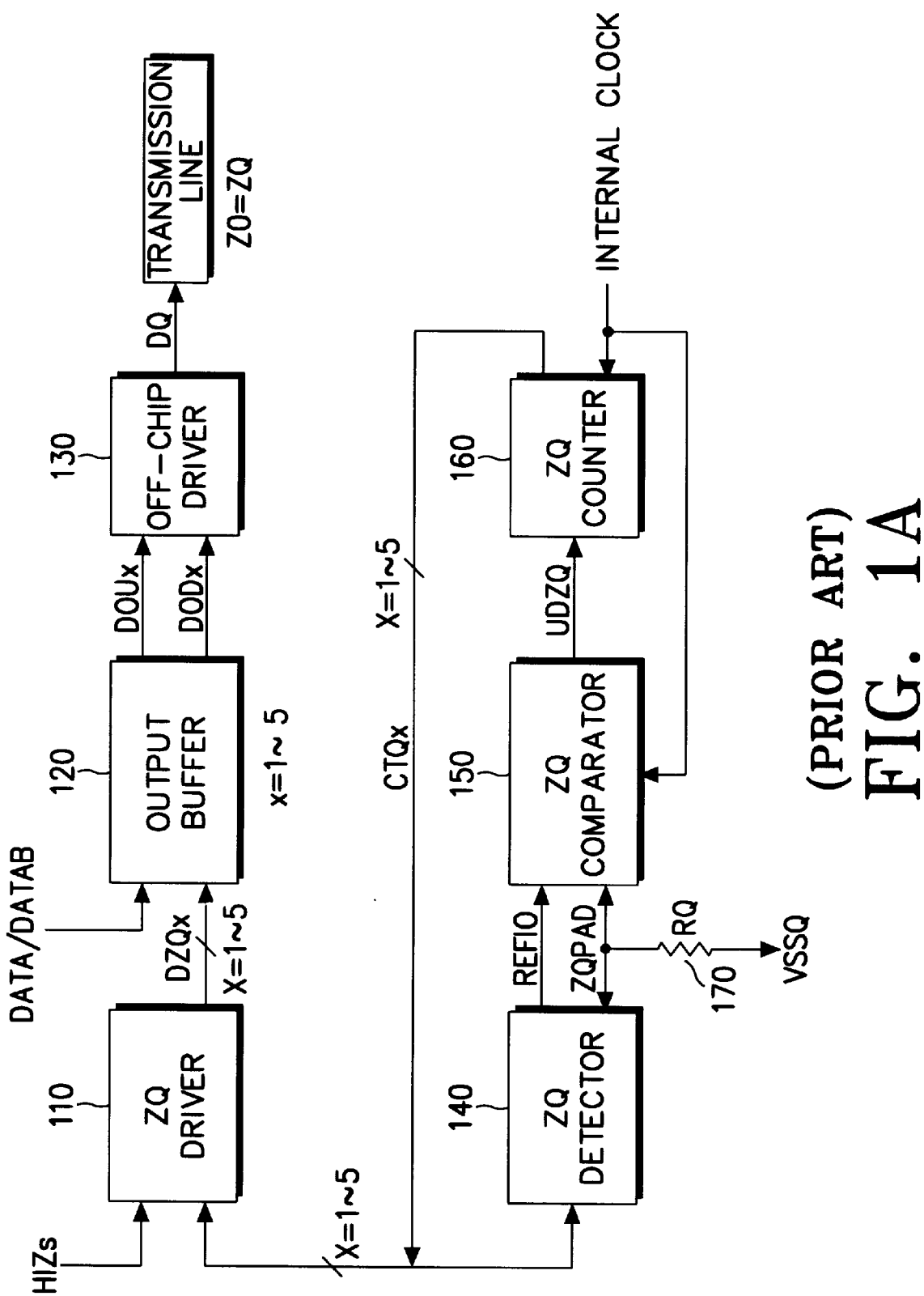
FIG. 1A is block schematic of a conventional integrated driver circuit.
Figure 1B:
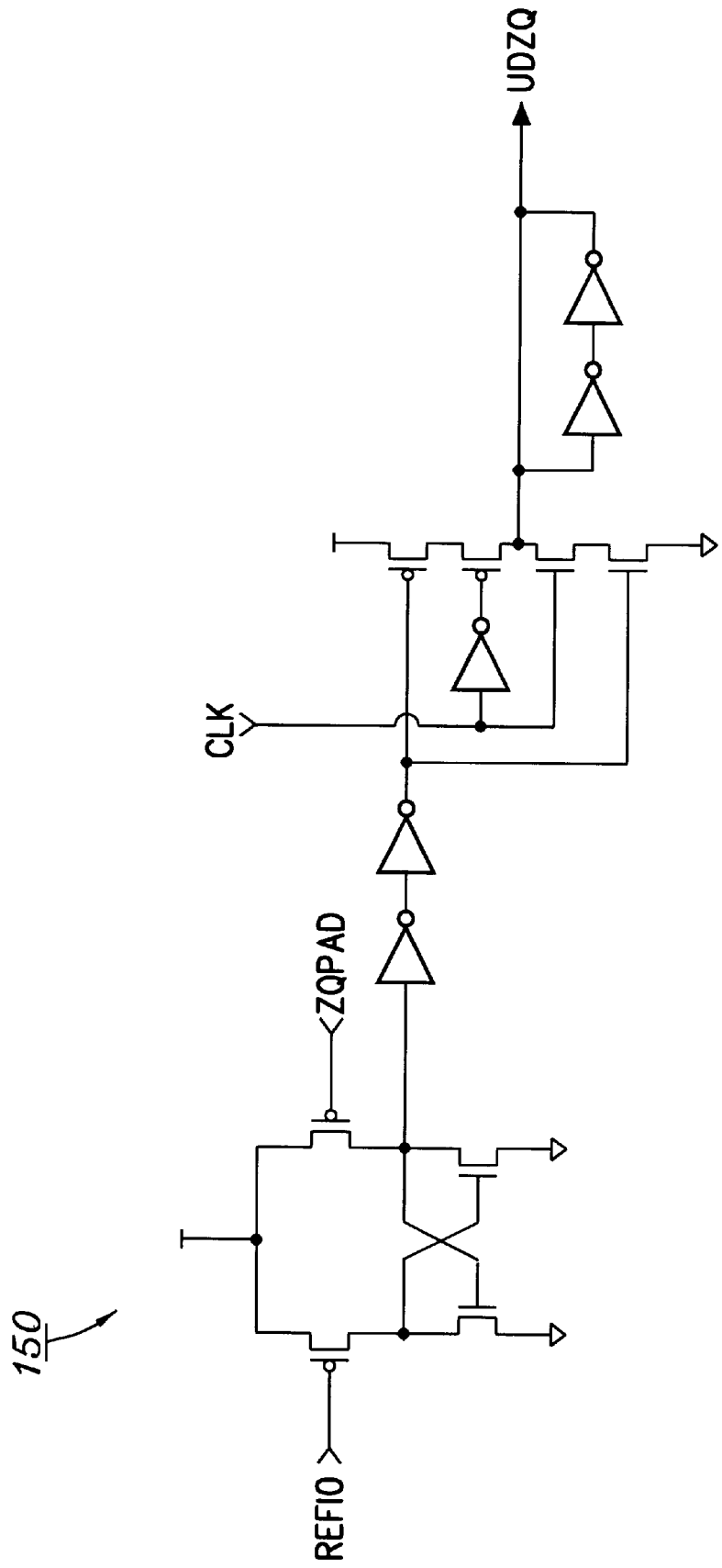
FIG. 1B is an electrical schematic of the ZQ comparator of FIG. 1A.
Figure 1C:
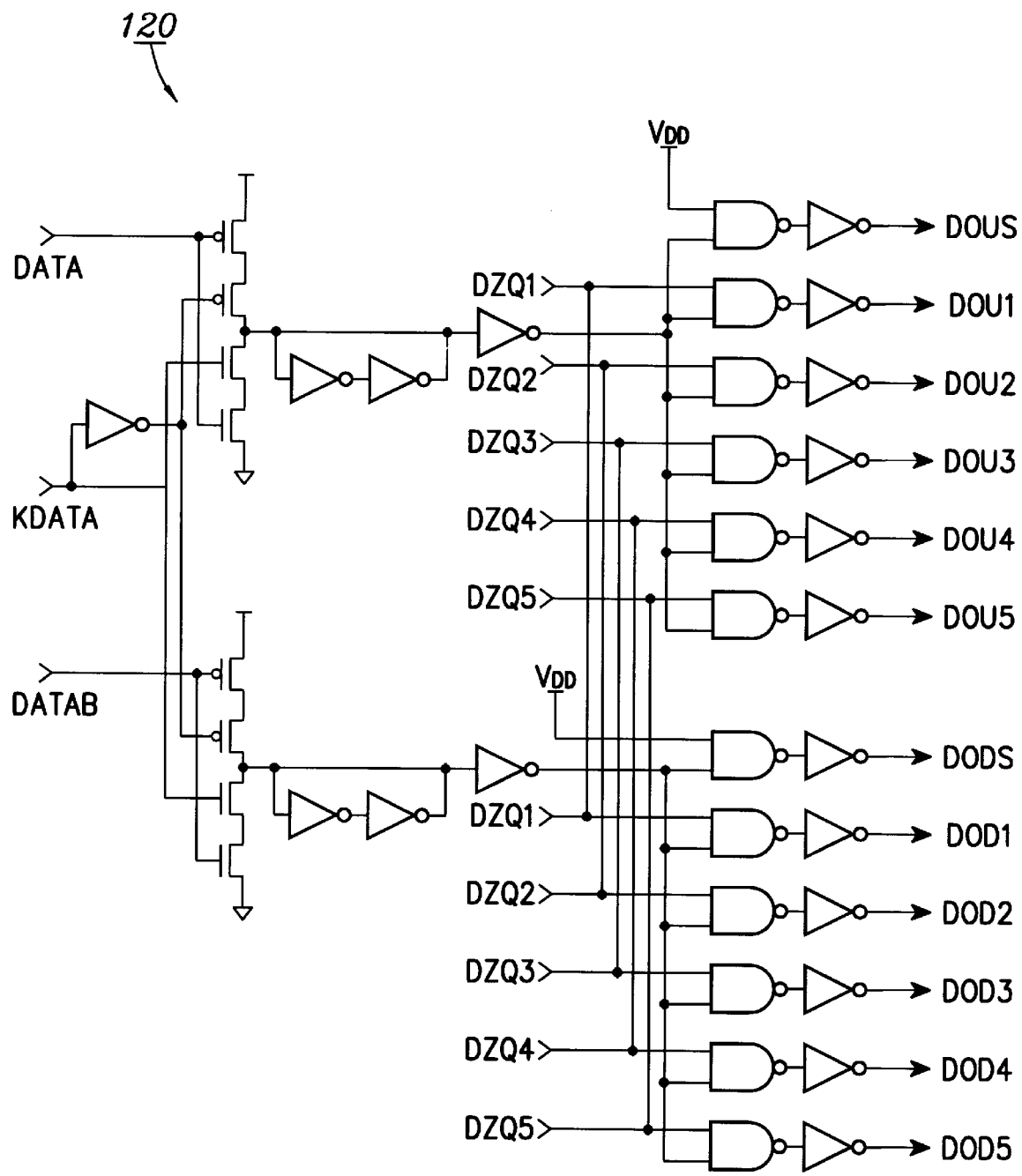
FIG. 1C is an electrical schematic of the output buffer of FIG. 1A.
Figure 2:
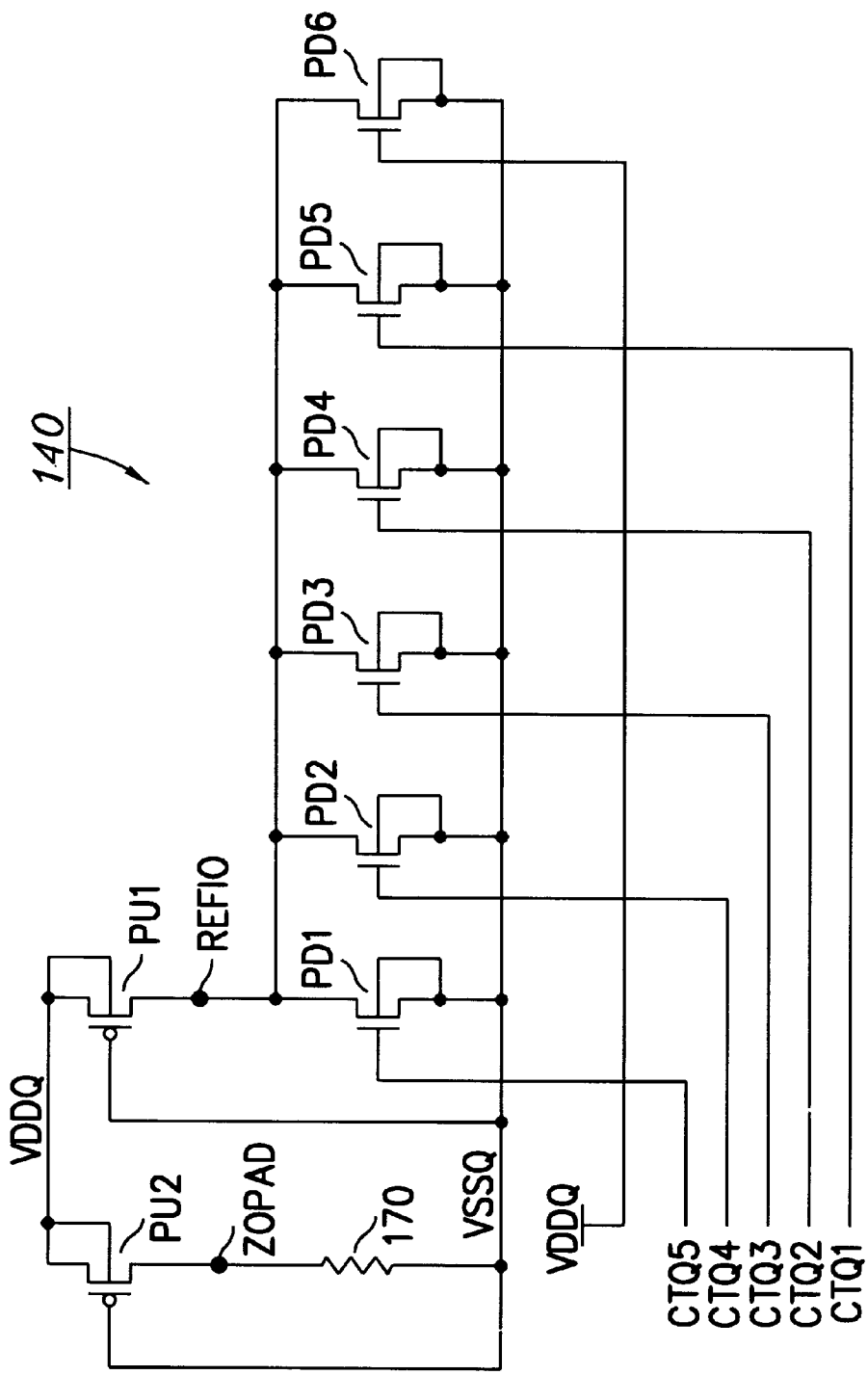
FIG. 2 is an electrical schematic of the detector 140 of FIG. 1.
Figure 4:
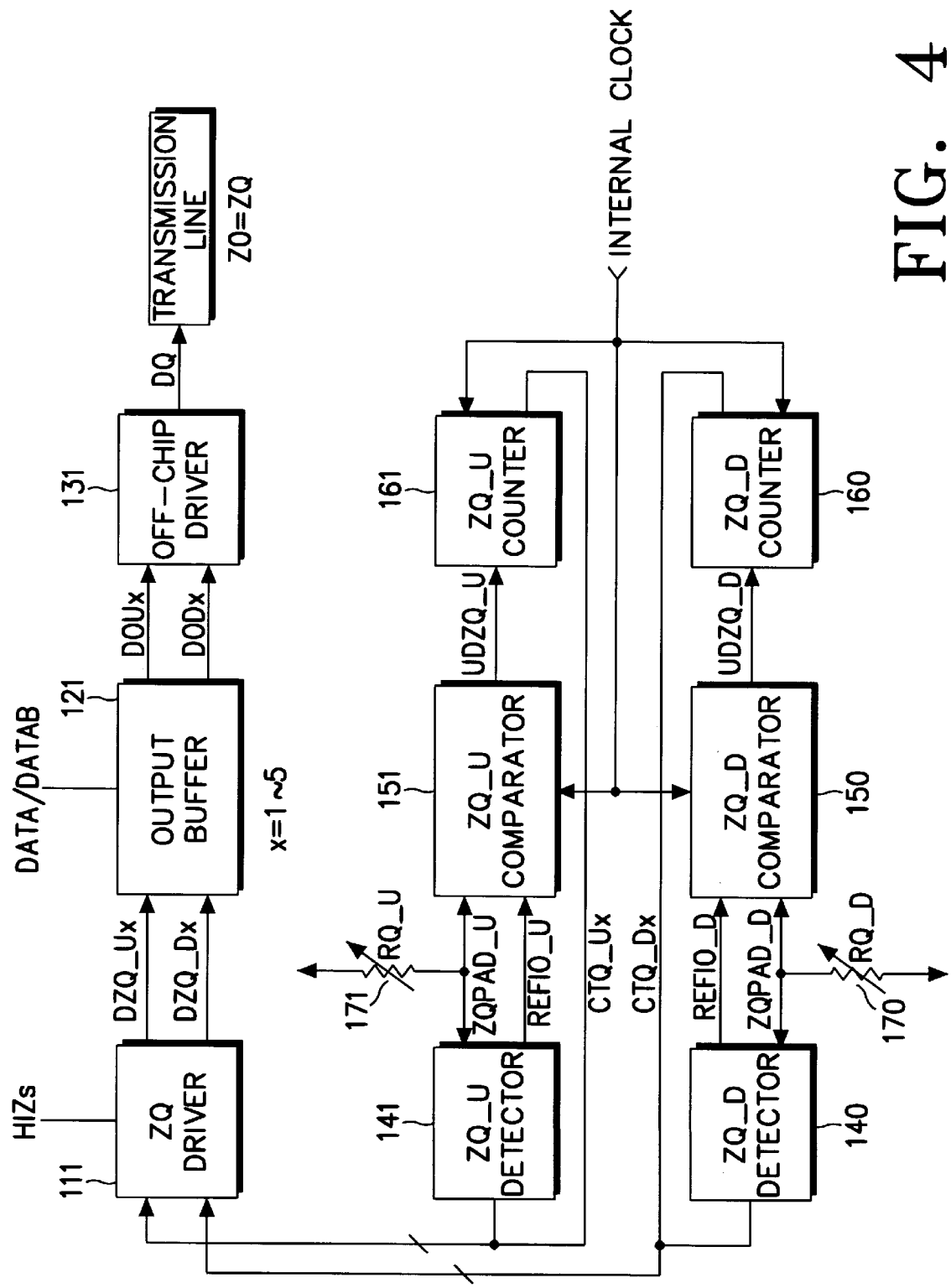
FIG. 4 is a block schematic of an integrated driver circuit according to an embodiment of the present invention.

Referring now to FIG. 4, a block schematic of a programmable integrated driver circuit according to an embodiment of the present invention will be described. In contrast to the driver circuit of FIG. 1, this preferred driver circuit of FIG. 4 includes separate off-chip variable resistance devices 170 and 171 (e.g., potentiometers) which can be independently controlled to provide separately programmable pull-up impedance control and separately programmable pull-down impedance control in the off-chip driver 131. Here, the off-chip driver 131 drives an output DQ with a logic 1 or logic 0 output signal which corresponds to the differential data signal DATA/DATAB. This differential data signal may be generated by a pair of differential bit lines in an SRAM memory device, for example.

Figure 6:
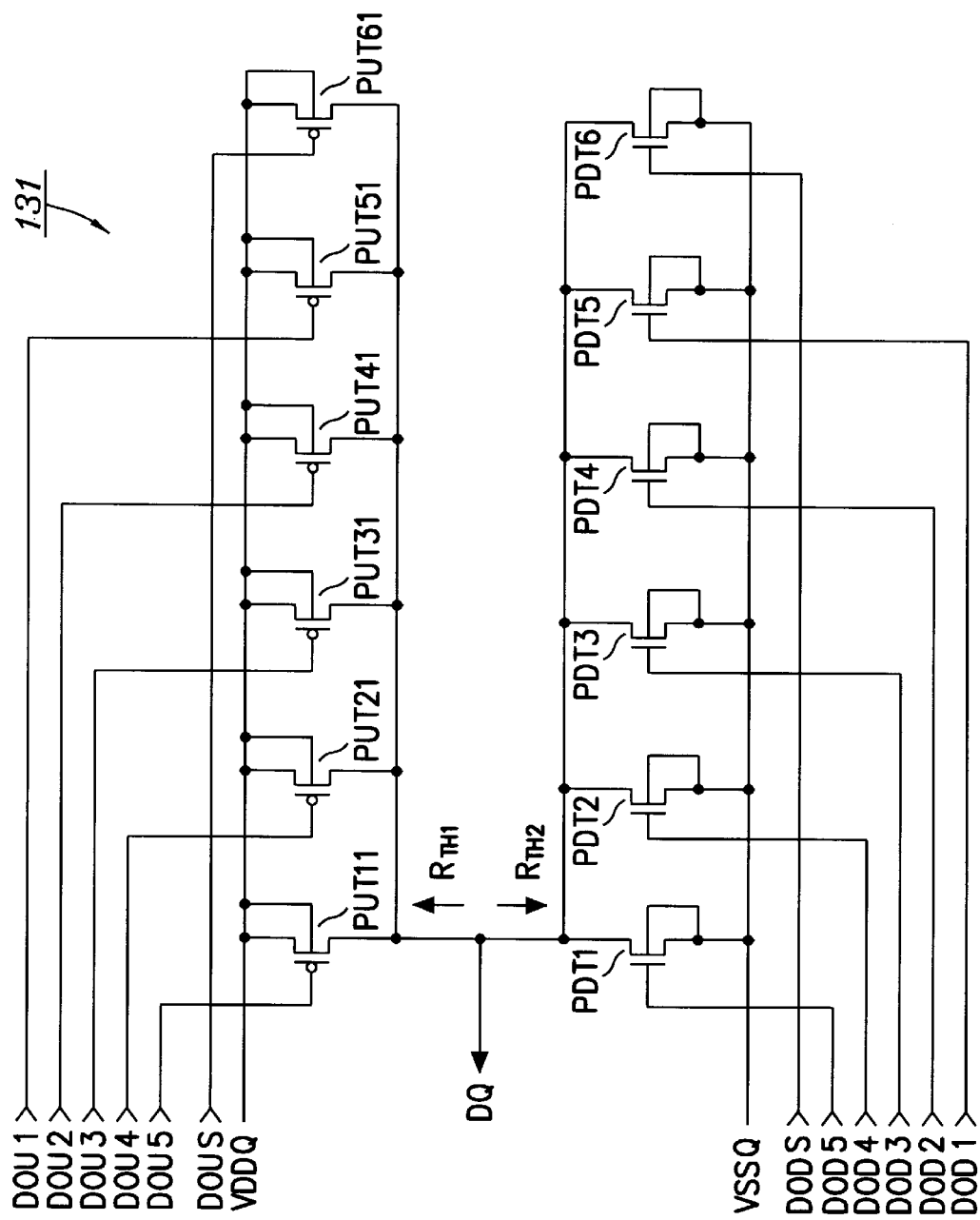
FIG. 6 is an electrical schematic of off-chip driver 131 of FIG. 4.

As illustrated in detail by FIG. 6, the off-chip driver 131 includes a plurality of PMOS pull-up transistors PUT11–PUT61 which are connected in parallel between a first reference potential VDDQ and the output DQ and a plurality of NMOS pull-down transistors PDT1–PDT6 which are connected in parallel between a second reference potential VSSQ and the output DQ. Each of the pull-up transistors has a gate electrode which is responsive to a respective impedance control pull-up signal (i.e., DOU1–DOU5 and DOUS) and each of the pull-down transistors PDT1–PDT6 has a gate electrode which is responsive to a respective impedance control pull-down signal (i.e., DOD1–DOD5 and DODS). These control signals essentially establish the Thevenin resistances $R_{TH1}$ and $R_{TH2}$ of the driver, as measured from the output DQ.

As will be understood by those skilled in the art, a digitally adjustable pull-up impedance is formed by the transistor array PUT11–PUT51 and PUT61 consisting of six (6) PMOS transistors which are each controlled by a respective pull-up signal. The width of each of the PMOS transistors PUT11-PUT51 may be set to $2^{N-1}W_{ref}$ (where N=5) so that the least significant impedance control pull-up signal DOU1 enables the device with width $2^0 W_{ref}$ while the most significant impedance control pull-up signal DOU5 enables the device with width $2^4 W_{ref}$. Here, DOUS is set to a logic 1 potential whenever DATA is set to a logic 1 potential and DODS is set to a logic 1 potential whenever DATAB is set to a logic 1 potential. Thus, the impedance control pull-up signals can be used to dynamically adjust the width of the combined transistor array.

Figure 7:
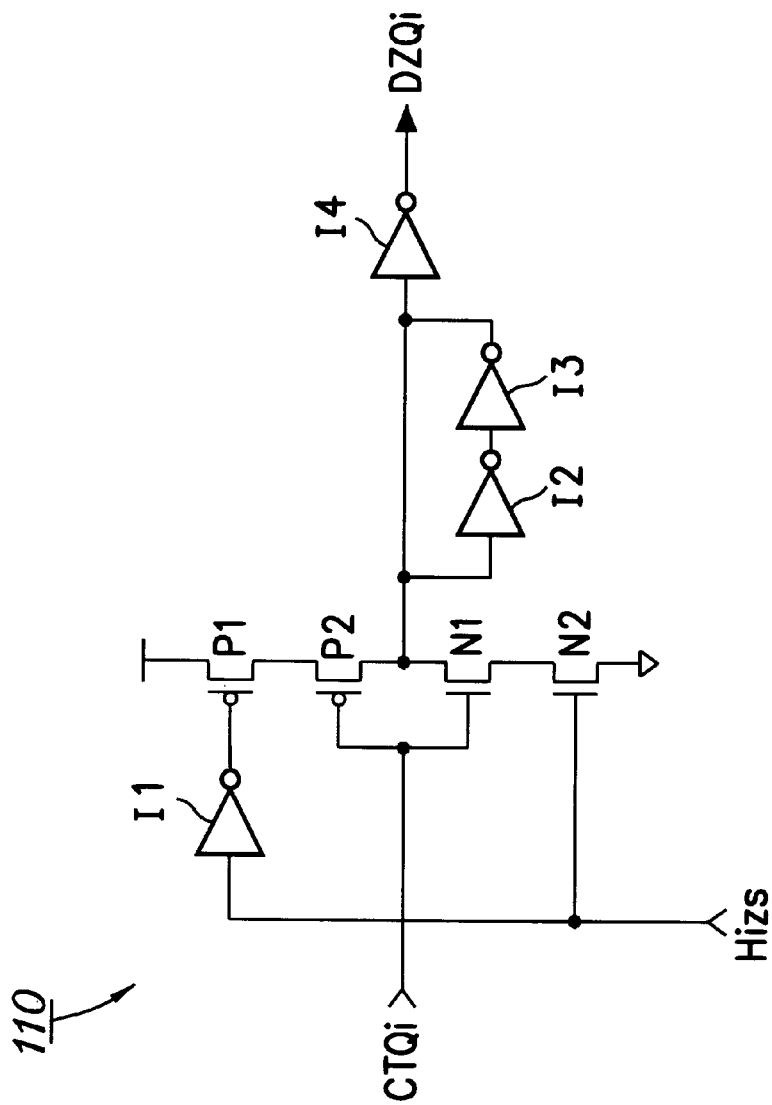
FIG. 7 is an electrical schematic of a portion of the ZQ driver 110 of FIG. 1.

Referring again to FIG. 4, these impedance control pull-up and pull-down signals DOUx and DODx are generated by a preferred output buffer 121. This output buffer 121 has inputs which receive a differential data signal DATA/DATAB and also receive the multi-bit outputs DZQ_Ux and DZQ_Dx of a ZQ driver 111. This ZQ driver is similar to the driver of FIG. 7, but is twice the size and has expanded functionality to handle both multi-bit up-count signals and multi-bit down-count signals CTQ_Ux and CTQ_Dx, respectively.

The multi-bit down-count signal CTQ_Dx is generated by a ZQ_D counter 160 which is responsive to an internal clock and signal UDZQ_D. Signal UDZQ_D is generated by a ZQ_D comparator 150. The multi-bit down-count signal CTQ_Dx is also fed back to a ZQ_D detector 140 which generates a down reference voltage REFIO_D. This down reference voltage REFIO_D varies in response to the multi-bit down-count signal CTQ_Dx. Moreover, this down reference voltage REFIO_D is compared to the potential which appears across an off-chip variable resistor 170 (having a resistance RQ_D) at pad ZQPAD_D. In particular, the ZQ_D comparator 150 controls the level of signal UDZQ_D. The level of signal UDZQ_D can be varied up or down by the comparator 150 depending on whether the reference voltage REFIO_D is greater than or less than the potential at pad ZQPAD_D. The ZQ_D counter 160 also counts up or counts down and thereby varies the down-count signal CTQ_Dx in response to the level of signal UDZQ_D.

Figure 5:
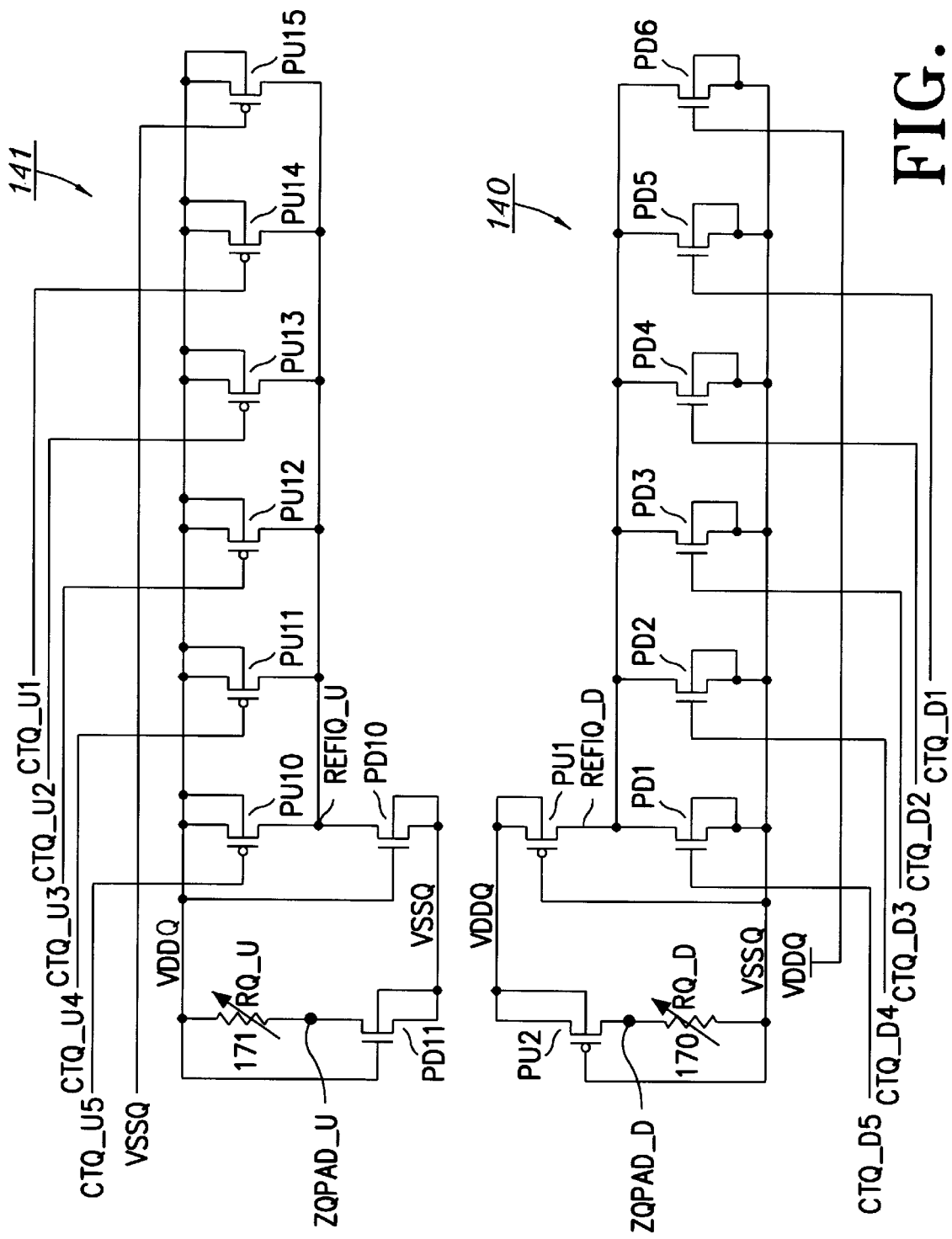
FIG. 5 is an electrical schematic of the detectors 140 and 141 of FIG. 4.

Referring now to FIG. 5, the ZQ_D detector 140 includes a plurality of NMOS pull-down transistors PD1–PD6 which are responsive to the multi-bit count down signals CTQ_Dx (e.g., CTQ_D1–CTQ_D5) and VDDQ, as illustrated. A pair of PMOS pull-up transistors PU1 and PU2 are also provided to pull up pad ZQPAD_D and output node REFIO_D. As will be understood by those skilled in the art, the potential of pad ZQPAD_D will vary as the resistance of the off-chip variable resistor 170 is varied and the potential of output node REFIO_D will vary as the combined parallel resistance of NMOS pull-down transistors PD1–PD6 is varied in response to the multi-bit down-count signal CTQ_Dx. The potential of output node REFIO_D will initially be set at a level which is a function of the on-state resistance of PMOS pull-up transistor PU1 and NMOS pull-down transistor PD6. Moreover, the comparator 150 and counter 160 are configured so that any variation in the off-chip variable resistor 170 to a particular resistance value will result in the generation of a corresponding multi-bit down-count signal CTQ_Dx. This corresponding count signal CTQ_Dx will act to turn on one or more of the NMOS pull-down transistors PD1–PD5 so that the potential of output node REFIO_D can be adjusted to a potential which is essentially equal to the potential of pad ZQPAD_D. The ZQ driver 111 and output buffer 121 will then convert the corresponding down-count signal CTQ_Dx to a respective impedance control pull-down signal (i.e., DOD1–DOD5 and DODS), as illustrated in FIG. 6. In this manner, the effective pull-down impedance $Z_{down}$ of the off-chip driver 131 can be independently adjusted (e.g., $Z_{down}$=0.2 (RQ_D)) to match the characteristic impedance Z0 of the load. Accordingly, when the resistance of the variable resistor 170 is increased, the potential at ZQPAD_U will rise above the initially established reference voltage REFIO_D. The ZQ_D comparator 150 compares the increased potential at the ZQPAD_D against the reference voltage REFIO_D and generates an output UDZQ_D which causes the ZQ_D counter 160 to count up and generate new count signals CTQ-Dx. This up counting continues until the reference voltage REFIO_D is reestablished at the potential of ZQPAD_D.

Likewise, as illustrated best by FIG. 4, the multi-bit up-count signal CTQ_Ux is generated by a ZQ_U counter 161 which is responsive to an internal clock and signal UDZQ_U. Signal UDZQ_U is generated by a ZQ_U comparator 151. The multi-bit up-count signal CTQ_Ux is also fed back to a ZQ_U detector 141 which generates an up reference voltage REFIO_U. This up reference voltage REFIO_U varies in response to the multi-bit down-count signal CTQ_Ux. This up reference voltage REFIO_U is compared to the potential which appears across an off-chip variable resistor 171 (having a resistance RQ__U) at pad ZQPAD__U. In particular, the ZQ__U comparator 151 controls the level of signal UDZQ__U. The level of signal UDZQ__U can be varied up or down by the comparator 151 depending on whether the reference voltage REFIO__U is greater than or less than the potential at pad ZQPAD__U. The ZQ__U counter 161 also counts up or counts down and thereby varies the up-count signal CTQ__Ux in response to the level of signal UDZQ__U.

Referring again to FIG. 5, the ZQ__U detector 141 includes a plurality of PMOS pull-up transistors PU10–PU15 which are responsive to the multi-bit count up signals CTQ__Ux (e.g., CTQ__U1–CTQ__U5) and VSSQ, as illustrated. A pair of NMOS pull-down transistors PD11 and PD10 are also provided to pull down pad ZQPAD__U and pull down output node REFIO__U. As will be understood by those skilled in the art, the potential of pad ZQPAD__U will vary as the resistance of the off-chip variable resistor 171 is varied and the potential of output node REFIO__U will vary as the combined parallel resistance of PMOS pull-up transistors PU10–PU15 is varied in response to the multi-bit up-count signal CTQ__Ux. The potential of output node REFIO__U will initially be set at a level which is a function of the on-state resistance of NMOS pull-down transistor PD10 and PMOS pull-up transistor PU15. Moreover, the comparator 151 and counter 161 are configured so that any variation in the off-chip variable resistor 171 to a particular resistance value will result in the generation of a corresponding multi-bit up-count signal CTQ__Ux. This corresponding count signal CTQ__Ux will act to turn on one or more of the PMOS pull-up transistors PU10–PU14 so that the potential of output node REFIO__U can be adjusted to a potential which is essentially equal to the potential of pad ZQPAD__U. The ZQ driver 111 and output buffer 121 will then convert the corresponding up-count signal CTQ__Ux to a respective impedance control pull-up signal (i.e., DOU1–DOU5 and DOUS), as illustrated in FIG. 6. In this manner, the effective pull-up impedance $Z_{up}$ of the off-chip driver 131 can be independently adjusted (e.g., $Z_{up}$=0.2 (RQ__U)) to match the characteristic impedance Z0 of the load. Accordingly, when the resistance of the variable resistor 171 is increased, the potential at ZQPAD__U will drop below the initially established reference voltage REFIO__U. The ZQ__U comparator 151 compares the lowered potential at the ZQPAD__U against the reference voltage REFIO__U and generates an output UDZQ__U which causes the ZQ__U counter 161 to count down and generate new count signals CTQ-Ux. This down counting continues until the reference voltage REFIO__U is reestablished at the potential of ZQPAD__U.

Figure 3:
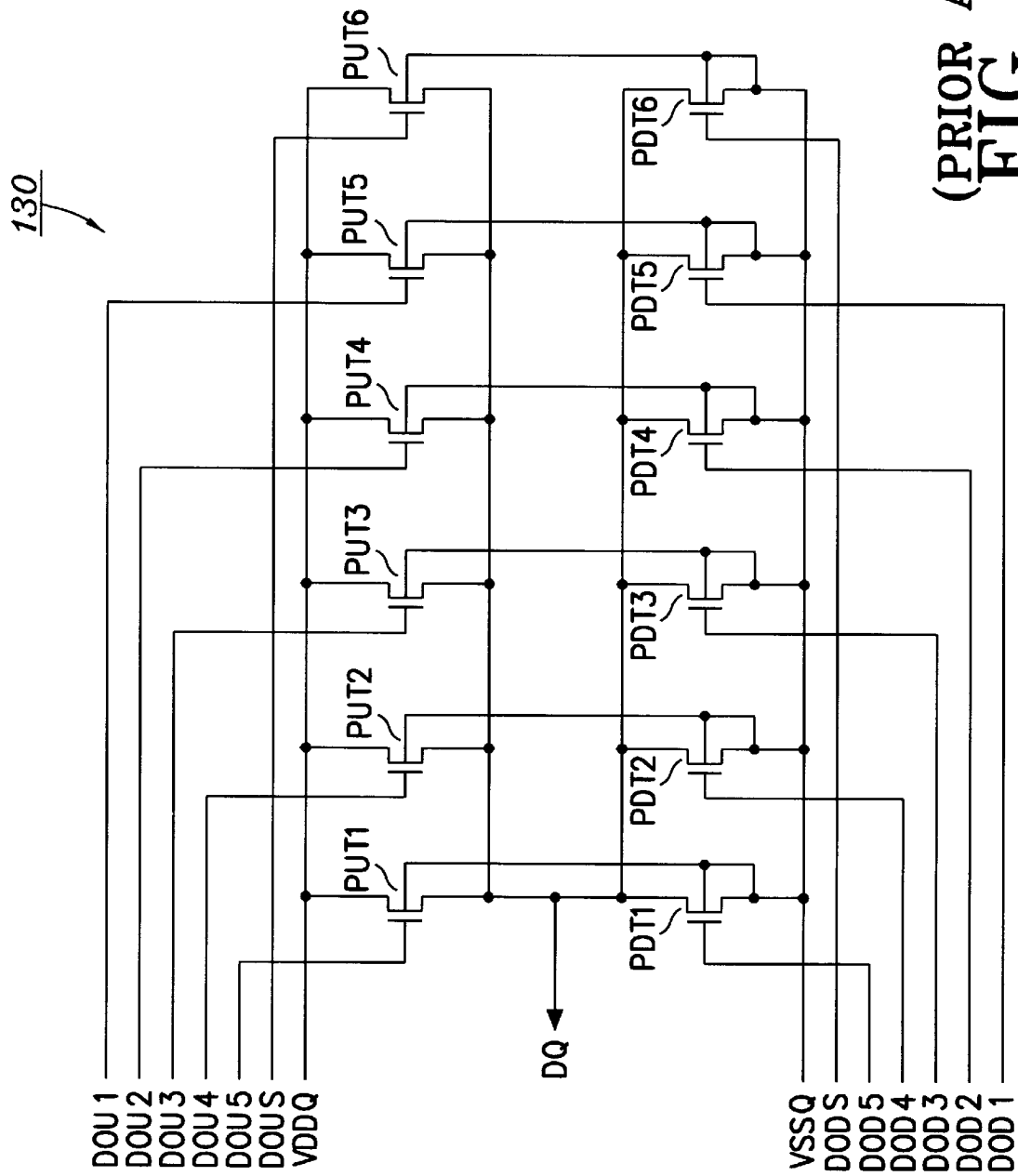
FIG. 3 is an electrical schematic of the off-chip driver 130 of FIG. 1.

Thus, as compared to the off-chip driver 130 of FIG. 3, the off-chip driver 131 of FIG. 6 provides more accurate and independent impedance control. Moreover, since the PMOS pull-up transistors PU10–PU15 of the ZQ__U detector 141 are of the same type as the PMOS pull-up transistors PUT11–PUT61 of the off-chip driver 131 of FIG. 6, variations in the power supply voltage VDDQ (which is commonly supplied to the source terminals of the PMOS transistors) can be compensated for by the ZQ__U detector 141 of FIG. 5. In addition, impedance variations caused by changed process parameters during fabrication can also be compensated for. Finally, the parasitic back-bias effects associated with the off-chip driver 130 of FIG. 3 can be significantly reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated driver circuit, comprising:
    a pull-up circuit that is responsive to a first plurality of impedance control signals and has a first impedance which is a function of a first variable resistance device;
    a pull-down circuit electrically coupled to said pull-up circuit, said pull-down circuit responsive to a second plurality of impedance control signals and having a second impedance which is a function of a second variable resistance device having a resistance value that is independently controllable relative to a resistance value of the first variable resistance device;
    means, electrically coupled to said pull-up circuit, for generating the first plurality of impedance control signals which operate to set the first impedance to a level which is proportional to a resistance of the first variable resistance device;
    means, electrically coupled to said pull-down circuit, for generating the second plurality of impedance control signals which operate to set the second impedance to a level which is proportional to a resistance of the second variable resistance device;
    wherein said means for generating the first plurality of impedance control signals comprises a first detector having a second plurality of PMOS pull-up transistors therein; and
    wherein said means for generating the second plurality of impedance control signals comprises a second detector having a second plurality of NMOS pull-down transistors therein.

2. The driver circuit of claim 1, wherein said pull-up circuit and said pull-down circuit have commonly connected outputs; wherein the first impedance is equal to a Thevenin impedance of said pull-up circuit as measured from the output thereof; and wherein the second impedance is equal to a Thevenin impedance of said pull-down circuit as measured from the output thereof.

3. The driver circuit of claim 2, wherein the first variable resistance device and the second variable resistance device are external to said first pull-up circuit and said second pull-up circuit, respectively.

4. The driver circuit of claim 3, wherein the resistance of the first variable resistance device is unequal to the resistance of the second variable resistance device.

5. The driver circuit of claim 1, wherein said pull-up circuit comprises a first plurality of PMOS transistors; and wherein said pull-down circuit comprises a first plurality of NMOS transistors.

6. The driver circuit of claim 5, wherein said means for generating the first plurality of impedance control signals comprises a first comparator and a first counter which is responsive to an output of the first comparator; wherein the first comparator compares the resistance of the first variable resistance device against a resistance of a reference PMOS pull-up transistor in the second plurality of PMOS pull-up transistors and generates a count-up signal if the resistance of the first variable resistance device is greater than the resistance of the reference PMOS pull-up transistor; and wherein the first counter counts up in response to the count-up signal.

7. The driver circuit of claim 6, wherein said means for generating the second plurality of impedance control signals comprises a second comparator and a second counter which is responsive to an output of the second comparator; wherein the second comparator compares the resistance of the second variable resistance device against a resistance of a reference NMOS pull-down transistor in the second plurality of NMOS pull-down transistors and generates a count-down signal if the resistance of the second variable resistance device is greater than the resistance of the reference NMOS pull-down transistor; and wherein the second counter counts down in response to the count-down signal.

8. An integrated driver circuit, comprising:
   a pull-up circuit having a first plurality of PMOS pull-up transistors therein which are selectively enabled by a first multi-bit impedance control signal which is a function of a resistance of a first variable resistance device;
   a pull-down circuit having a first plurality of NMOS pull-down transistors therein which are selectively enabled by a second multi-bit impedance control signal which is a function of a resistance of a second variable resistance device that is independently controllable relative to the first variable resistance device;
   a first detector that is electrically connected to the first variable resistance device and comprises a second plurality of PMOS pull-up transistors; and
   a second detector that is electrically connected to the second variable resistance device and comprises a second plurality of NMOS pull-down transistors.

9. The driver circuit of claim 8, wherein said pull-up circuit and said pull-down circuit have commonly connected outputs; wherein said pull-up circuit has a first impedance which is a function of a digital value of the first multi-bit impedance control signal; and wherein said pull-down circuit has a second impedance which is a function of a digital value of the second multi-bit impedance control signal.

10. The driver circuit of claim 9, wherein the first impedance is equal to a Thevenin impedance of the pull-up circuit as measured from the output thereof; and wherein the second impedance is equal to a Thevenin impedance of the pull-down circuit as measured from the output thereof.

11. The driver circuit of claim 9, wherein the first variable resistance device and the second variable resistance device are external to said pull-up circuit and said pull-up circuit, respectively.

12. The driver circuit of claim 8, wherein the resistance of the first variable resistance device is unequal to the resistance of the second variable resistance device.

13. The driver circuit of claim 8, further comprising:
   a first comparator; and
   a first counter that is responsive to an output of said first comparator;
   wherein the first comparator compares the resistance of the first variable resistance device against a resistance of a reference PMOS pull-up transistor in the second plurality thereof and generates a count-up signal if the resistance of the first variable resistance device is greater than the resistance of the reference PMOS pull-up transistor; and
   wherein the first counter counts up in response to the count-up signal.

14. The driver circuit of claim 13, further comprising:
   a second comparator; and
   a second counter that is responsive to an output of said second comparator;
   wherein the second comparator compares the resistance of the second variable resistance device against a resistance of a reference NMOS pull-down transistor in the second plurality thereof and generates a count-down signal if the resistance of the second variable resistance device is greater than the resistance of the reference NMOS pull-down transistor; and
   wherein the second counter counts down in response to the count-down signal.

* * * * *